(12) United States Patent
Jang

(10) Patent No.: US 7,462,793 B2
(45) Date of Patent: Dec. 9, 2008

(54) DISPLAY UNIT AND MOBILE TERMINAL HAVING THE SAME

(75) Inventor: Sung-Bae Jang, Incheon (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/419,263

(22) Filed: May 19, 2006

(65) Prior Publication Data

US 2006/0266632 A1 Nov. 30, 2006

(30) Foreign Application Priority Data

May 24, 2005 (KR) ...................... 10-2005-0043863

(51) Int. Cl.
*H01H 9/00* (2006.01)

(52) U.S. Cl. .................................... 200/310
(58) Field of Classification Search .................. 200/310
See application file for complete search history.

(56) References Cited

U.S. PATENT DOCUMENTS

| 5,357,065 | A | * | 10/1994 | Mitamura et al. | ........... | 200/5 A |
| 6,259,044 | B1 | * | 7/2001 | Paratore et al. | ............. | 200/5 A |
| 7,019,242 | B2 | * | 3/2006 | Kim | ............................. | 200/514 |
| 7,097,479 | B2 | * | 8/2006 | Lee | ............................. | 439/165 |
| 7,229,289 | B2 | * | 6/2007 | Bang | ............................. | 439/31 |
| 2004/0259587 | A1 | * | 12/2004 | Chadha | .................... | 455/550.1 |
| 2006/0098119 | A1 | * | 5/2006 | Lee | ............................. | 348/376 |
| 2007/0123295 | A1 | * | 5/2007 | Kim et al. | ................ | 455/550.1 |

FOREIGN PATENT DOCUMENTS

| CN | 1230838 A | 10/1999 |
| EP | 0928128 A1 | 7/1999 |
| EP | 1418734 | 5/2004 |
| EP | 1489821 | 12/2004 |
| JP | 4-117850 | 4/1992 |

OTHER PUBLICATIONS

English Language Abstract of JP 4-117850.

* cited by examiner

*Primary Examiner*—Elvin Enad
*Assistant Examiner*—Lheiren Mae A Anglo
(74) *Attorney, Agent, or Firm*—Greenblum & Bernstein, P.L.C.

(57) ABSTRACT

A display unit includes a display having a first surface, a second surface and a side surface extending between the first surface and the second surface, and a board configured to extend from the side surface in a direction substantially perpendicular thereto. Because a component for connecting the display and a keypad is omitted, a fabrication cost can be reduced, and the thickness of the display unit, and a mobile terminal having such a display unit, can be reduced.

27 Claims, 3 Drawing Sheets

DISPLAY UNIT AND MOBILE TERMINAL HAVING THE SAME

This application claims the benefit of Korean Application No. 10-2005-0043863, filed on May 24, 2005, which is hereby incorporated by reference in its entirety.

BACKGROUND OF THE INVENTION

1. Field of the Invention

The present invention relates to a display unit and to a mobile terminal. More particularly, the present invention relates to a display unit having a reduced thickness, and to a thin mobile terminal having a reduced thickness display unit.

2. Description of the Related Art

FIG. 1 is a side view showing a display unit of a conventional mobile terminal.

The conventional display unit includes a display 114 having a front side configured to be exposed on an outer surface of a case 112, a keypad assembly 116 disposed below the display 114 for inputting information, and an FPCB (Flexible Printed Circuit Board) 120 for electrically connecting the display 114 and the keypad assembly 116. Display related components 118 are mounted on the FPCB 120.

The keypad assembly 116 includes key buttons 122 configured to be exposed on an outer surface of the case 112 for pressing activation by an operator, and a board 126 connected with the FPCB 120 by a connector 132. The board 126 includes dome switches 124 mounted on its front surface for inputting signals according to a pressing operation of the key buttons 122, and a connector 136 mounted at its rear surface for connection with a main PCB mounted in a terminal body.

A pad 130 is attached at a lower surface of the key buttons 122, and includes actuators 128 for transferring the pressing operation of the key buttons 122 to the dome switches 124.

The FPCB 120 is connected with one end of the display 114 and is configured to be folded along a lower surface of the display 114. The connector 132 is mounted on a lower surface of the FPCB 120, and connects the display related components 118 with the board 126.

Because the thickness (T1) of the conventional display unit is the sum of the thickness of the display 114, the thickness of the folded FPCB 120, the thickness of the connector 132, the thickness of the board 126, and the thickness of the connector 136, it is accordingly relatively thick. Thus, the overall thickness of a mobile terminal having such a conventional display unit is increased.

BRIEF DESCRIPTION OF THE INVENTION

In view of the foregoing, the present invention, through one or more of its various aspects, embodiments, and/or specific features or sub-components, is thus intended to bring out one or more of the advantages as specifically noted below.

One exemplary feature of the present invention is to provide a display unit with a reduced thickness by elimination of the FPCB which generally connects a display and a keypad. This can be achieved by integrally forming the display with a keypad. This can result in a thinner mobile terminal, and a reduction in fabrication costs.

According to one aspect of the present invention, there is provided a display unit including a display having a first surface, a second surface and a side surface extending between the first surface and the second surface, and a board configured to extend from the side surface in a direction substantially perpendicular thereto.

The display and the board may be integrally formed. The board may include a component mounted thereon, a total thickness of the board and the component being less than a thickness of the display. The display and the board may be fabricated as a single assembly.

Switches configured for inputting signals by pressing key buttons may be mounted on an upper surface of the board. The switches may include dome switches. The switches may include touch sensors configured for inputting signals according to capacitance. Key buttons for activating the switches are configured and arranged to be exposed on an outer surface of a case. The key buttons may be illuminated by light emitted from the display. A light guide plate may be installed below the key buttons and configured to direct light from the display toward the key buttons.

The display and the board may be connected to each other via a connection member. The connection member may have a component related to operation of the display mounted on a surface thereof. A connector configured for connection to a main printed circuit board may be mounted on a rear surface of the board.

The board may extend from the side surface in a direction substantially parallel to the first and second surfaces. The side surface may be substantially perpendicular to the first and second surfaces.

According to another aspect of the present invention, there is provided a mobile terminal including a terminal body and a display unit movably connected to the terminal body. The display unit includes a display having a first surface, a second surface and a side surface extending between the first surface and the second surface, and a board configured to extend from the side surface in a direction substantially perpendicular thereto.

The display and the board may be integrally formed. The board may include a component mounted thereon, a total thickness of the board and the component being less than a thickness of the display. The display and the board may be fabricated as a single assembly.

Switches configured for inputting signals by pressing key buttons may be mounted on an upper surface of the board. The switches may include dome switches. The switches may include touch sensors configured for inputting signals according to capacitance. Key buttons for activating the switches are configured and arranged to be exposed on an outer surface of a case. The key buttons may be illuminated by light emitted from the display. A light guide plate may be installed below the key buttons and configured to direct light from the display toward the key buttons.

The display and the board may be connected to each other via a connection member. The connection member may have a component related to operation of the display mounted on a surface thereof. A connector configured for connection to a main printed circuit board in the terminal body may be mounted on a rear surface of the board.

The board may extend from the side surface in a direction substantially parallel to the first and second surfaces. The side surface may be substantially perpendicular to the first and second surfaces.

The display unit may be slidably connected to the terminal body. The display unit may be configured to be movable relative to the terminal body between an open position and a closed position.

Additional advantages, objects, and features of the invention will be set forth in part in the description which follows and in part will become apparent to those having ordinary skill in the art upon examination of the following or may be learned from practice of the invention.

BRIEF DESCRIPTION OF THE DRAWINGS

The present invention is further described in the detailed description that follows, by reference to the noted drawings by way of non-limiting examples of embodiments of the present invention, in which like reference numerals represent similar parts throughout several views of the drawings, and in which.

DETAILED DESCRIPTION OF THE INVENTION

Figure 1:
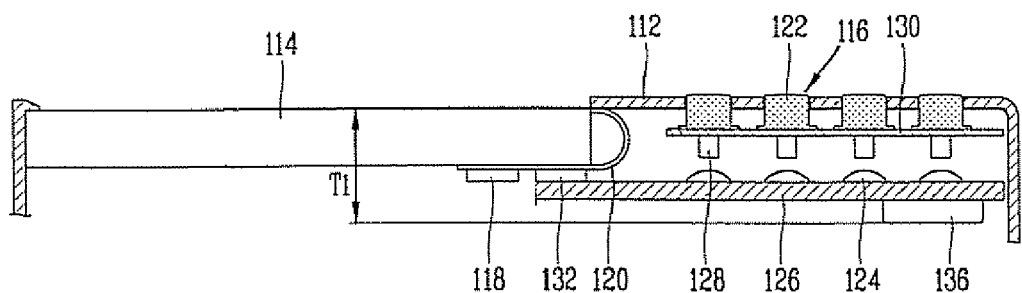
FIG. 1 is a sectional view of a display unit of a conventional mobile terminal.

The present invention will be described below with reference to the embodiments shown in the drawings.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 2:
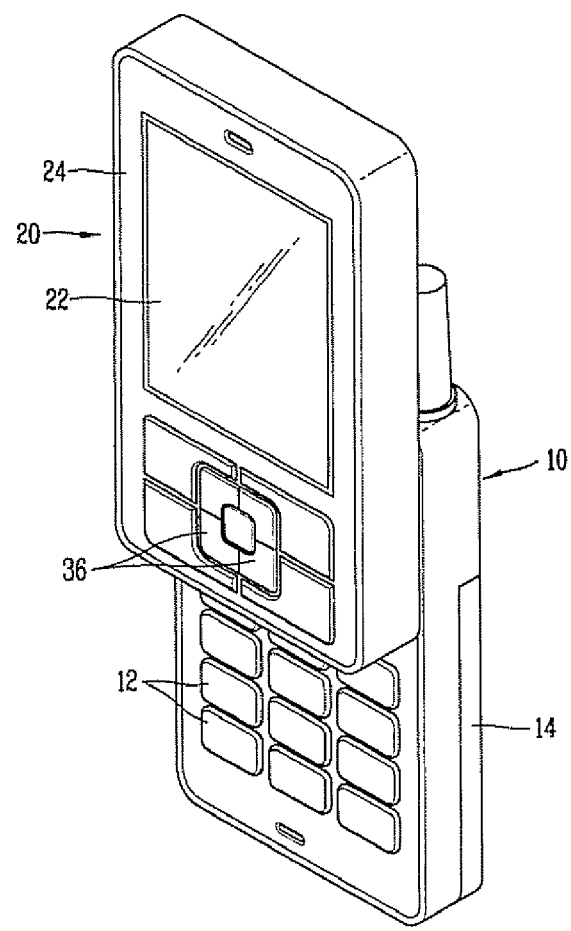
FIG. 2 is a perspective view of a mobile terminal in accordance with a first embodiment of the present invention.

FIG. 2 is a perspective view of a mobile terminal in accordance with first embodiment of the present invention. Examples of such a mobile terminal include, but are not limited to, a mobile phone, a PDA, a laptop computer, a portable music player, a portable game device, a camera, or a camcorder.

Figure 3:
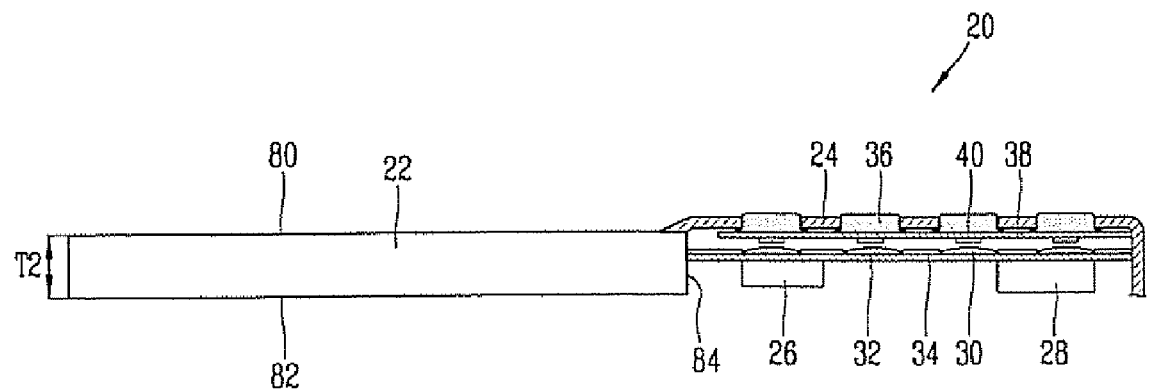
FIG. 3 is a sectional side view of a display unit in accordance with the first embodiment of the present invention.

FIG. 3 is a sectional side view of a display unit in accordance with the first embodiment of the present invention. Examples of such a display unit include, but are not limited to, LCD or plasma type displays.

The mobile terminal depicted in FIG. 2 includes a terminal body 10 which includes a keypad 12 mounted on its front surface to allow a user to input information, and a battery 14 mounted on its rear surface. A display unit 20 is mounted in such a manner as to be opened and closed relative to the terminal body 10. The display unit has a display 22 for displaying information. As noted above, the display can be any suitable type of display, such as an LCD.

A main PCB (printed circuit board) on which various circuit components are mounted is installed inside the terminal body 10, and is electrically connected with the display unit 20.

The mobile terminal depicted in FIG. 2 is a slide type mobile terminal in which the display unit 20 is mounted so as to be slidable over the terminal body 10. However, any suitable type of mobile terminal display mounting can be provided, such as a folder type, a bar type or a swivel type.

The display unit 20 includes a case 24, the display 22 being mounted on the case 24 for displaying information. A board 32 is directly connected with the display 22, and has switches 30 formed on its front surface for inputting information. The board 32 has components 26 related to operation of the display on its lower surface, and a connector 28 for connection with the main PCB on its lower surface. The board 32 can be any suitable type of board, such as a hard PCB, or a flexible FPCB.

The display 22 has a first surface 80, a second surface 82 and a plurality of side surfaces 84 between the first surface 80 and the second surface 82. As depicted in FIG. 3, the board 32 extends from one of the side surfaces 84 in a longitudinal direction, substantially perpendicular to such side surface 84. The board 32 also extends substantially parallel to the first and second surfaces 80, 82.

Key buttons 36 for inputting signals according to a pressing operation by a user are disposed on the case 24 in such a manner as to be exposed to an outer surface of the case 24. The switches 30 may be of any suitable type, such as dome switches, for activation by operation of the key buttons 36. A pad 38 on which actuators 40 for pressing the switches 30 are formed is attached on the lower surface of the key buttons 36. Further, although key buttons 36 are shown in embodiment depicted in FIG. 3, any suitable type of input device may be provided.

The board 32 and the display 22 may be fabricated as a single assembly such that the display 22 and the board 32 are integrally connected. The board 32 and the display 22 may be integrally fabricated and then assembled inside the case 24. Providing such an integral board and display reduces fabrication costs and the potential for erroneous assembly.

The board 32 and the display 22 may also be disposed on the same plane so as to be level with each other. As shown in FIG. 3, one end of the display 22 and one end of the board 32 are directly connected and horizontally disposed to relative to each other.

As shown in FIG. 3, the total thickness of the board 32, and the connector 28 and components 26 mounted on the board 32, is preferably smaller than the thickness (T2) of the display 22. Accordingly, since the thickness (T2) of the display 22 is larger than the combined thickness of the components mounted in the display unit 20, the thickness of the overall display unit 20 can be reduced.

A light guide plate 34 is provided on the upper surface of the board 32, for guiding a portion of the light generated by a light emitting element of the display 22 toward the key buttons 36. In this manner, light for illuminating the display 22 can be diffused to the light guide plate 34 in order to illuminate the key buttons 36. Since light from the light emitting element of the display 22 is used to illuminate the key buttons 36, it is not necessary to provide a separate light emitting diode on the board 32, and fabrication costs can be reduced.

Assembly of a mobile terminal in accordance with one embodiment of the present invention will be described. First, switches 30 are installed on the upper surface of the board 32, the display related components 26 and the connector 28 are mounted on the bottom surface of the board 32, and the board 32 and the display 22 are integrally connected to form a single assembly. Next, the light guide plate 34 is installed on the upper surface of the board 32, and one side of the light guide plate 34 is connected with the light emitting element of the display 22. The board 32 and the display 22, fabricated as a single assembly, can then be assembled in the case 24 to complete assembly of the display unit 20.

Figure 4:
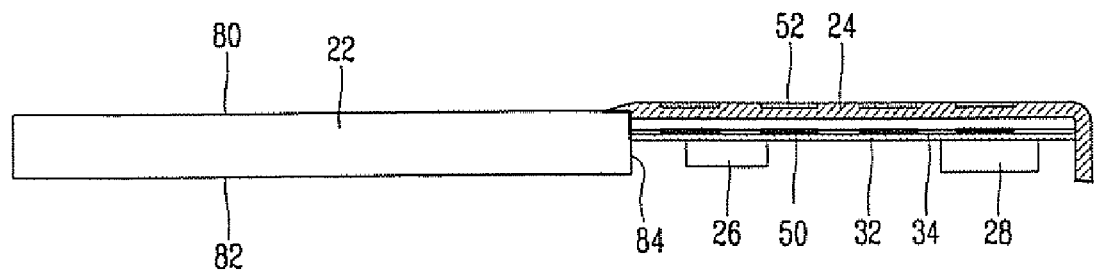
FIG. 4 is a sectional side view of a display unit in accordance with a second embodiment of the present invention.

FIG. 4 is a sectional side view of a display unit in accordance with a second embodiment of the present invention. The display unit in accordance with the second embodiment of the present invention is similar to the display unit of the first embodiment, except that the switches are in the form of touch sensors operated according to capacitance. Touch buttons 52 which are activated according to the touch of a user are provided on the case 24. Touch sensors 50, which generate signals according to capacitance by a user touching the touch buttons 52, are installed on the upper surface of the board 32.

Since the display unit in accordance with the second embodiment of the present invention includes touch sensors 50, there are no upwardly protruding portions, such as the dome switches 30. Accordingly, the thickness of the display unit can be reduced further.

Figure 5:
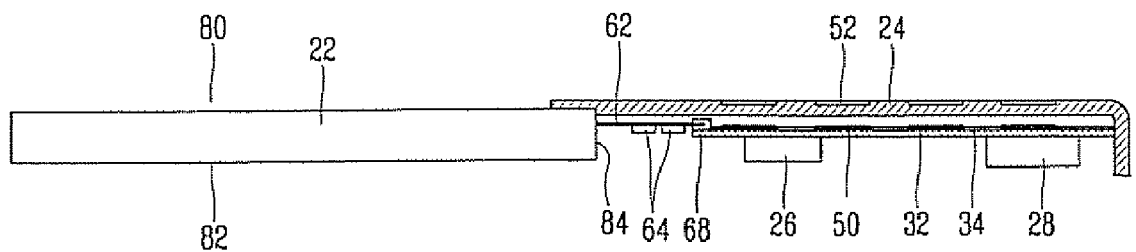
FIG. 5 is a sectional side view of a display unit in accordance with a third embodiment of the present invention.
Figure 6:
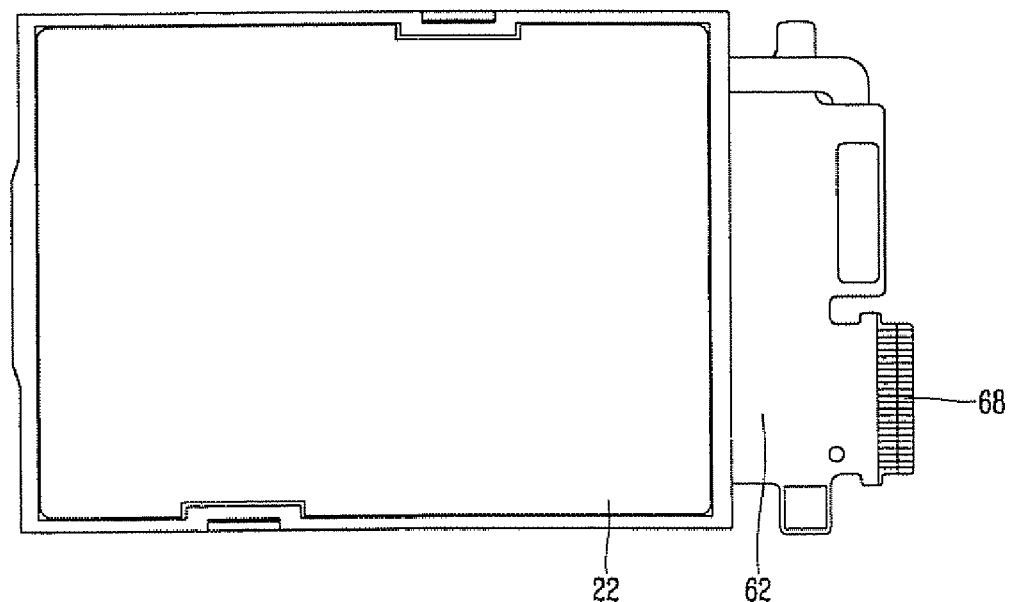
FIG. 6 is a front view of the display unit in accordance with the third embodiment of the present invention.

FIG. 5 is a sectional side view of a display unit in accordance with a third embodiment of the present invention, and FIG. 6 is a front view of the display unit of the third embodiment.

The display unit in accordance with the third embodiment of the present invention includes a case 24, a display 22 mounted in the case 24, and a board 32 disposed on the same horizontal plane as the display 22. The board 32 has switches 50 provided on its front surface for inputting information, and a connector 28 mounted on its lower surface for connection with the main PCB. A connection member 62 is connected with one end of the display 22, and is disposed to be level with the display 22. The connection member 62 has a connector 68 on an end opposite from the display 22, which is connected with the board 32. The connection member 62 also has components 64 related to the operation of the display mounted on a surface thereof.

The connection member 62 may be in the form of an FPCB. One end of the connection member 62 is connected to the display 22 in any suitable manner, such as by bonding. The other end of the connection member 62 includes the connector 68 which is configured for connection with the board 32. The display related components 64 may be mounted on upper or lower surfaces of the connection member 62. The connection member 62 has a smaller thickness than that of the display 22.

The board 32 may be similar to the boards described with regard to the first and the second embodiments. However, instead of being connected directly to the display 22, the board 32 in the third embodiment would be configured to connect with the connector 68 of the connection member 62.

The mobile terminal in accordance with the present invention has many advantages. For example, since the display and the board of the keypad assembly are directly connected and formed as a single assembly, the thickness of the display unit can be reduced. Accordingly, the mobile terminal can be thinner. Since the assembly process of the display unit is simplified, the fabrication process and fabrication costs can be also reduced.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

Although the invention has been described with reference to several exemplary embodiments, it is understood that the words that have been used are words of description and illustration, rather than words of limitation. As the present invention may be embodied in several forms without departing from the spirit or essential characteristics thereof, it should also be understood that the above-described embodiments are not limited by any of the details of the foregoing description, unless otherwise specified. Rather, the above-described embodiments should be construed broadly within the spirit and scope of the present invention as defined in the appended claims. Therefore, changes may be made within the metes and bounds of the appended claims, as presently stated and as amended, without departing from the scope and spirit of the invention in its aspects.

What is claimed is:

1. A mobile terminal, comprising:
  a terminal body; and
  a display unit movably connected to the terminal body, the display unit comprising:
  a display having a first surface, a second surface and a side surface extending between the first surface and the second surface; and
  a board configured to extend directly from the side surface in a direction substantially perpendicular thereto, wherein a component related to operation of the display is mounted on a rear surface of the board,
  wherein the display unit is slidably connected to the terminal body.

2. The mobile terminal of claim 1, wherein the display and the board are integrally formed.

3. The mobile terminal of claim 1, wherein the board includes a component mounted thereon, and a total thickness of the board and the component is less than a thickness of the display.

4. The mobile terminal of claim 1, wherein the display and the board are fabricated as a single assembly.

5. The mobile terminal of claim 1, wherein switches configured for inputting signals by pressing key buttons are mounted on an upper surface of the board.

6. The mobile terminal of claim 5, wherein the switches comprise dome switches.

7. The mobile terminal of claim 5, wherein the switches comprise touch sensors configured for inputting signals according to capacitance.

8. The mobile terminal of claim 5, wherein key buttons for activating the switches are configured and arranged to be exposed on an outer surface of a case.

9. The mobile terminal of claim 1, wherein the display and the board are connected to each other via a connection member.

10. The mobile terminal of claim 9, wherein the connection member has a component related to operation of the display mounted on a surface thereof.

11. The mobile terminal of claim 1, wherein a connector configured for connection to a main printed circuit board in the terminal body is mounted on a rear surface of the board.

12. The mobile terminal of claim 1, wherein the board extends from the side surface in a direction substantially parallel to the first and second surfaces.

13. The mobile terminal of claim 1, wherein the side surface is substantially perpendicular to the first and second surfaces.

14. The mobile terminal of claim 1, wherein the display unit is configured to be movable relative to the terminal body between an open position and a closed position.

15. A mobile terminal, comprising:
a terminal body; and
a display unit movably connected to the terminal body, the display unit comprising:
a display having a first surface, a second surface and a side surface extending between the first surface and the second surface; and
a board configured to extend from the side surface in a direction substantially perpendicular thereto, wherein a component related to operation of the display is mounted on a rear surface of the board,
wherein switches configured for inputting signals by pressing key buttons are mounted on an upper surface of the board, key buttons for activating the switches are configured and arranged to be exposed on an outer surface of a case, and the key buttons are illuminated by light emitted from the display.

16. The mobile terminal of claim 15, wherein a light guide plate is installed below the key buttons and is configured to direct light from the display toward the key buttons.

17. A mobile terminal, comprising:
a display having a first surface, a second surface and a side surface extending between the first surface and the second surface;
a flexible printed circuit board, connected to and extending from the side surface; and
a board, connected to the flexible printed circuit board, wherein the board supports
at least one switch for inputting information, provided on a front side of the board, and
at least one component relating to operation of the display, provided on a rear side of the board,
wherein a connector configured for connection to a main printed circuit board is mounted on a rear surface of the board.

18. The mobile terminal of claim 17, wherein a total thickness of the board and the at least one component is less than a thickness of the display.

19. The mobile terminal of claim 17, wherein the at least one switch comprises a dome switch.

20. The mobile terminal of claim 17, wherein at least one key button for activating the at least one switch is configured and arranged to be exposed on an outer surface of a case.

21. The mobile terminal of claim 17, wherein the at least one switch comprises a touch sensor configured for inputting signals according to capacitance.

22. The mobile terminal of claim 17, wherein the flexible printed circuit board extends from the side surface in a direction substantially parallel to the first and second surfaces.

23. The mobile terminal of claim 17, wherein the side surface is substantially perpendicular to the first and second surfaces.

24. The mobile terminal of claim 17, further comprising a first body and a second body configured to open with respect to the first body, the display being mounted in the second body.

25. The mobile terminal of claim 17, further comprising a body in which the display is mounted.

26. A mobile terminal, comprising:
a display having a first surface, a second surface and a side surface extending between the first surface and the second surface;
a flexible printed circuit board, connected to and extending from the side surface; and
a board, connected to the flexible printed circuit board, wherein the board supports
at least one switch for inputting information, provided on a front side of the board, and
at least one component relating to operation of the display, provided on a rear side of the board,
wherein at least one key button for activating the at least one switch is configured and arranged to be exposed on an outer surface of a case, and the at least one key button is illuminated by light emitted from the display.

27. The mobile terminal of claim 26, wherein a light guide plate is installed below the at least one key button and is configured to direct light from the display toward the at least one key button.

* * * * *